(12) United States Patent
Lindsay et al.

(10) Patent No.: US 7,737,009 B2
(45) Date of Patent: Jun. 15, 2010

(54) METHOD OF IMPLANTING A NON-DOPANT ATOM INTO A SEMICONDUCTOR DEVICE

(75) Inventors: Richard Lindsay, Fishkill, NY (US); Yong Meng Lee, Singapore (SG); Manfred Eller, Wappingers Falls, NY (US)

(73) Assignee: Infineon Technologies AG, Neubiberg (DE)

( * ) Notice: Subject to any disclaimer, the term of this patent is extended or adjusted under 35 U.S.C. 154(b) by 176 days.

(21) Appl. No.: 11/836,008

(22) Filed: Aug. 8, 2007

(65) Prior Publication Data

US 2009/0042359 A1 Feb. 12, 2009

(51) Int. Cl.
*H01L 21/265* (2006.01)
(52) U.S. Cl. ...................... 438/510; 257/288
(58) Field of Classification Search ................. 438/433, 438/510; 257/506, E21.537, E29.001, 288; *H01L 21/265, H01L 29/78*
See application file for complete search history.

(56) References Cited

U.S. PATENT DOCUMENTS

| | | | |
|---|---|---|---|
| 5,915,195 A * | 6/1999 | Fulford et al. ............... 438/524 |
| 6,207,532 B1 | 3/2001 | Lin et al. |
| 6,245,639 B1 * | 6/2001 | Tsai et al. .................... 438/424 |
| 6,284,626 B1 * | 9/2001 | Kim ........................... 438/433 |
| 6,323,106 B1 * | 11/2001 | Huang et al. ................ 438/433 |
| 6,472,301 B1 * | 10/2002 | Lin et al. .................... 438/524 |
| 6,514,833 B1 | 2/2003 | Ishida et al. |
| 6,590,271 B2 | 7/2003 | Liu et al. |
| 6,649,461 B1 | 11/2003 | Lai et al. |
| 6,780,730 B2 | 8/2004 | Lin |
| 6,797,592 B2 * | 9/2004 | Brown et al. ................ 438/510 |
| 2008/0286936 A1 * | 11/2008 | Zhao .......................... 438/433 |

\* cited by examiner

*Primary Examiner*—Kiesha R Bryant
*Assistant Examiner*—John Doyle
(74) *Attorney, Agent, or Firm*—Slater & Matsil, L.L.P.

(57) ABSTRACT

A method of forming an isolation trench structure is disclosed, the method includes forming an isolation trench in a semiconductor body associated with an isolation region, and implanting a non-dopant atom into the isolation trench, thereby forming a region to modify the halo profile in the semiconductor body. Subsequently, the isolation trench is filled with a dielectric material.

16 Claims, 9 Drawing Sheets

METHOD OF IMPLANTING A NON-DOPANT ATOM INTO A SEMICONDUCTOR DEVICE

TECHNICAL FIELD

The invention is related to a semiconductor structure and a method of producing the semiconductor structure. More particularly, the invention is directed to the formation of a transistor device structure with improved performance and a method for fabricating the same.

BACKGROUND

Continued CMOS scaling requires geometrical scaling of device dimensions with every technology generation. This primarily includes scaling the device width and length as well as other features of the technology. At short device widths, the formation and behavior of the active regions are dominated by the surrounding isolations regions. For example, the presence of high stress fields used in modern strained silicon technologies modulates the diffusion of dopants near the isolation regions. These differences, for instance, manifest as a change in device electrostatics (for example, threshold voltage of the device). Consequently, devices fabricated at various device widths are electrically different. This creates huge technological problems, as a typical technology includes devices drawn at a range of device widths. Such differences can easily derail a given technology from full entitlement. Hence, for continued CMOS scaling, devices fabricated at smaller widths are expected to perform similar to larger width devices. In other words, the technology is expected to demonstrate a uniform narrow width effect.

In various aspects, the present invention addresses the problem of creating devices with a uniform narrow width effect.

SUMMARY OF THE INVENTION

According to one aspect of the present invention, a trench with sidewalls is etched in a semiconductor body. Non-dopant ions are then implanted into the sidewalls of the trench. The trench is subsequently filled to form a trench isolation region. The active regions of the device are formed in the semiconductor regions abutting the trench.

The foregoing has outlined rather broadly features of the present invention. Additional features of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1a-1c illustrate the typical CMOS devices formed with an STI isolation process in accordance with an embodiment of the invention, wherein FIG. 1a represents a cross section of the device along its length; FIG. 1b represents a cross section along its width, and FIG. 1c represents a cross section from the top of the device;

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely improved narrow width devices in a CMOS device. Concepts of the invention can also be applied, however, to other electronic devices. As but one example, bipolar transistors (or BiCMOS) can utilize concepts of the present invention. Similarly, although the invention is disclosed for a planar MOS device, the invention can also be applied to other devices such as double gate devices and triple gate devices.

In one aspect, the present invention provides a method for reducing the deleterious impact of shallow trench isolations (STIs) on active regions of a transistor. In various examples provided, the invention is used to control this phenomenon to enable the formation of devices across a range of widths with equivalent electrical performance.

The method according to the present invention uses a non-dopant atom to locally tailor active regions around an isolation trench; thereby preserving device electrostatics. The non-dopant atom is implanted after the formation of the isolation trench, but before the isolation trench is filled. This implant decorates the edges or sidewalls of the isolation trench with the non-dopant impurity.

Figure 2A:
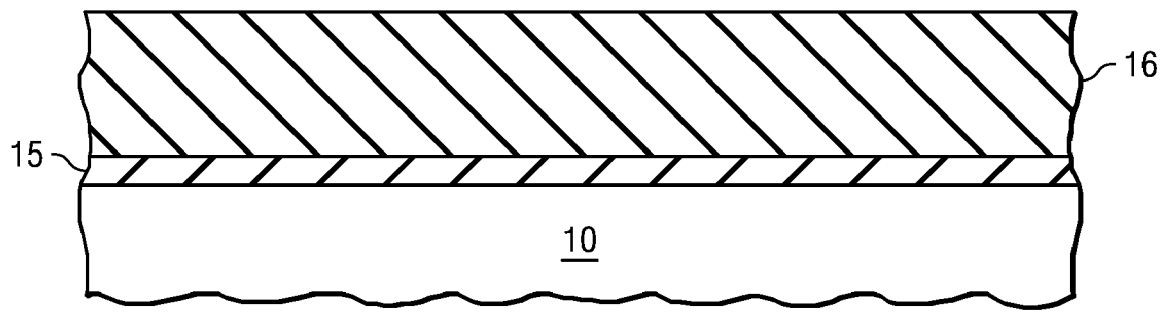
FIGS. 2a-2e illustrate a cross section along the width during the formation of the STI, in accordance with an embodiment of the invention.
Figure 2B:
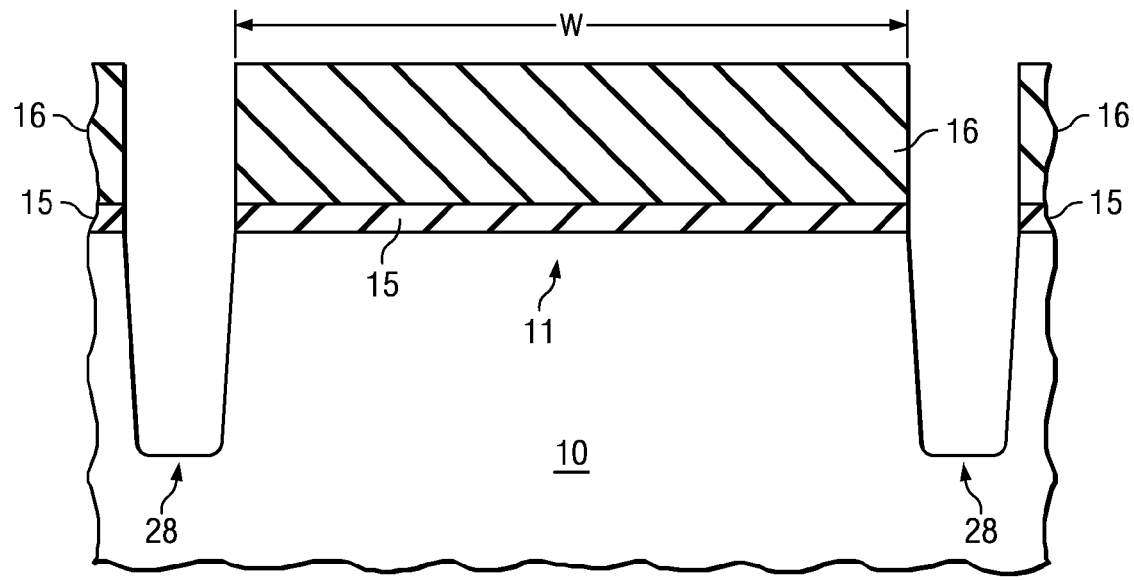
Figure 2C:
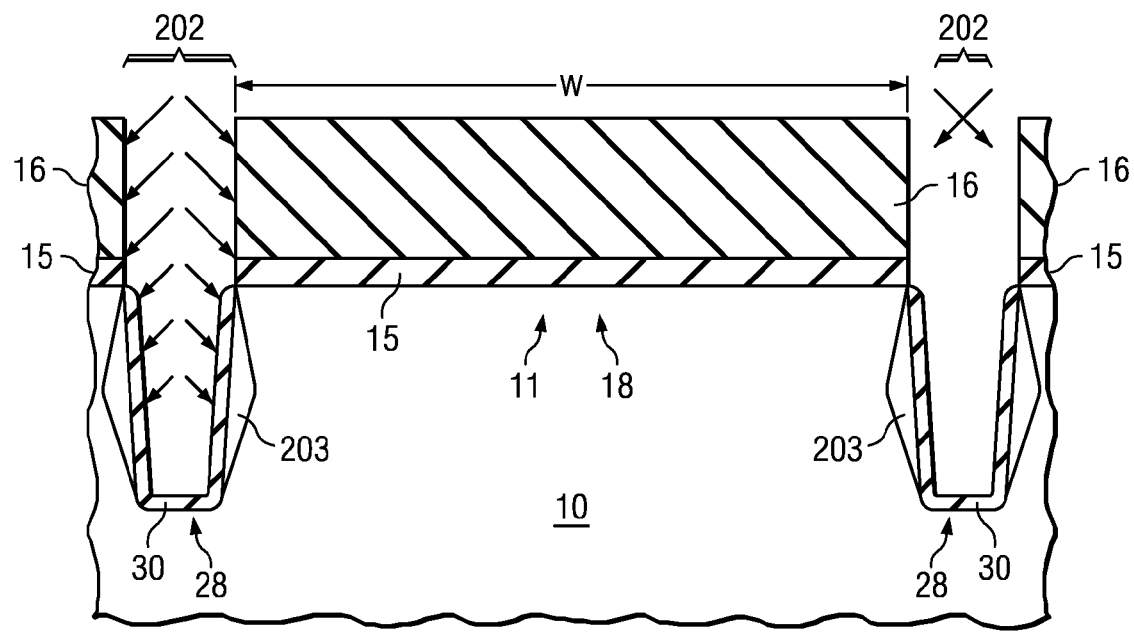
Figure 2D:
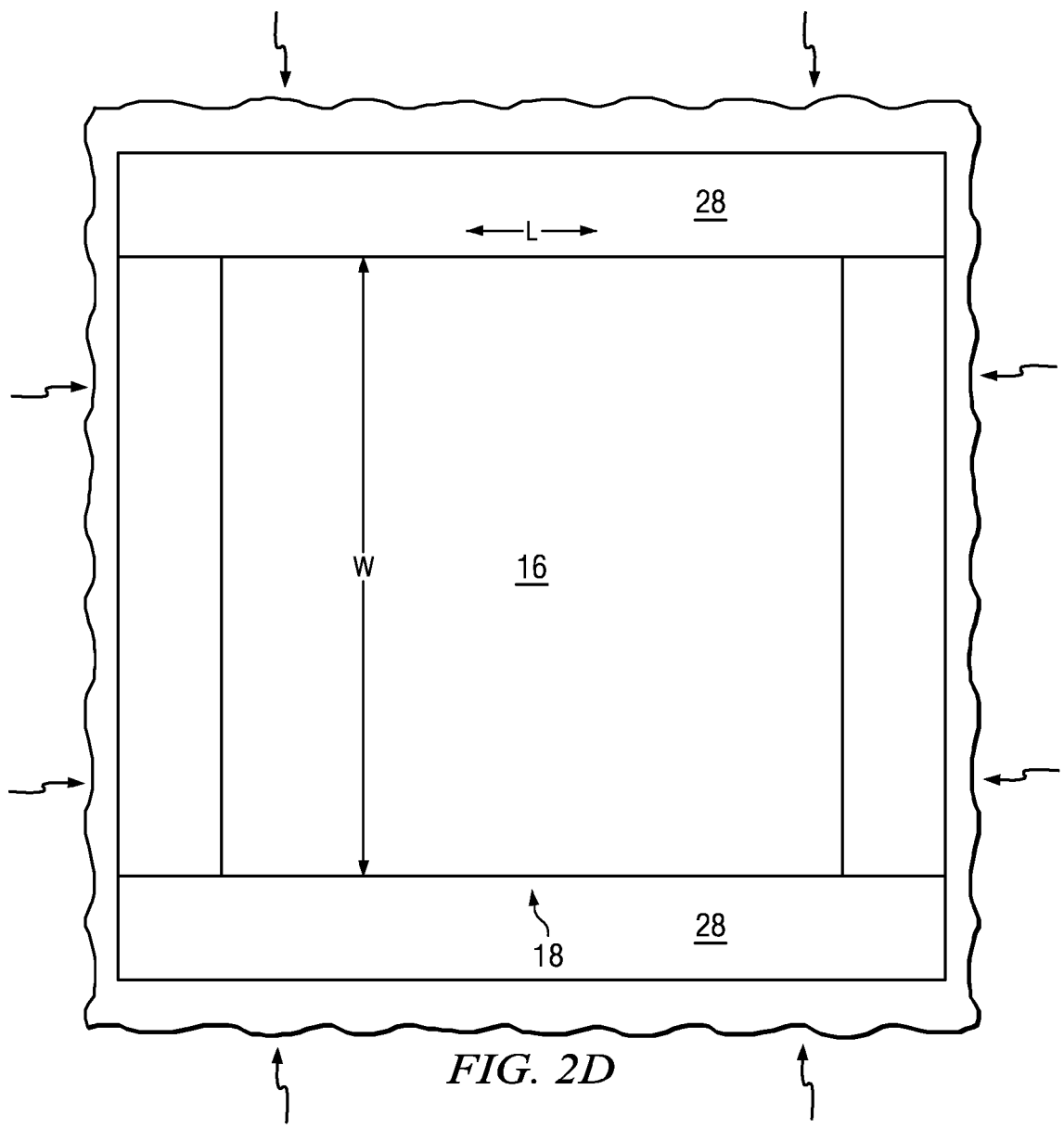
Figure 2E:
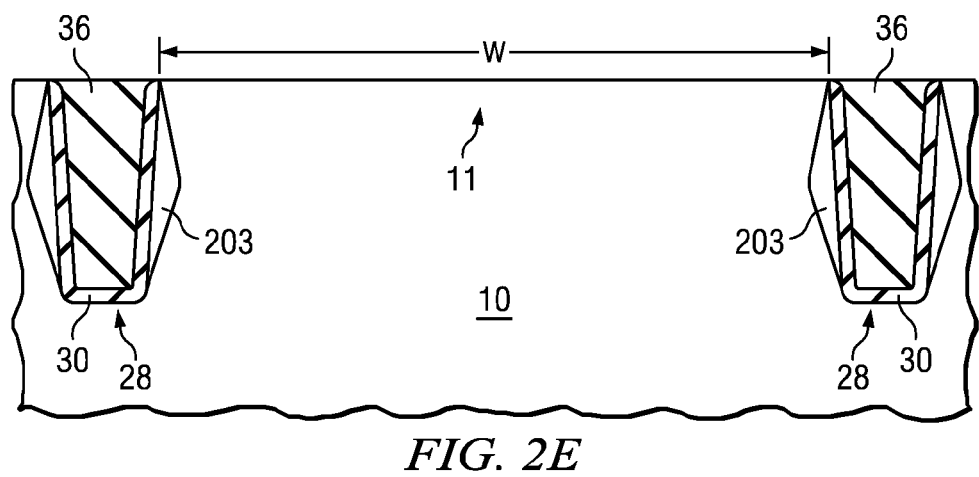
Figure 3A:
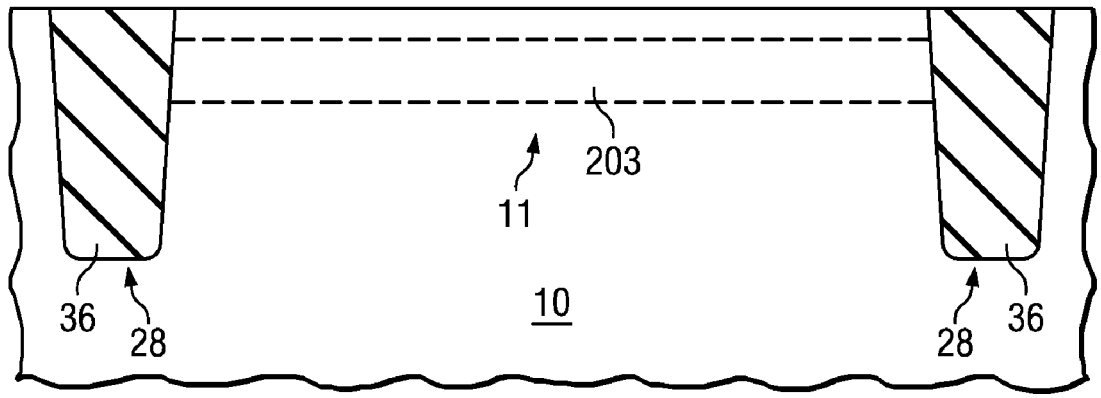
FIGS. 3a-3c illustrate a cross section along the length after the formation of the STI for the embodiment process illustrated in FIG. 2, in accordance with an embodiment of the invention.
Figure 3B:
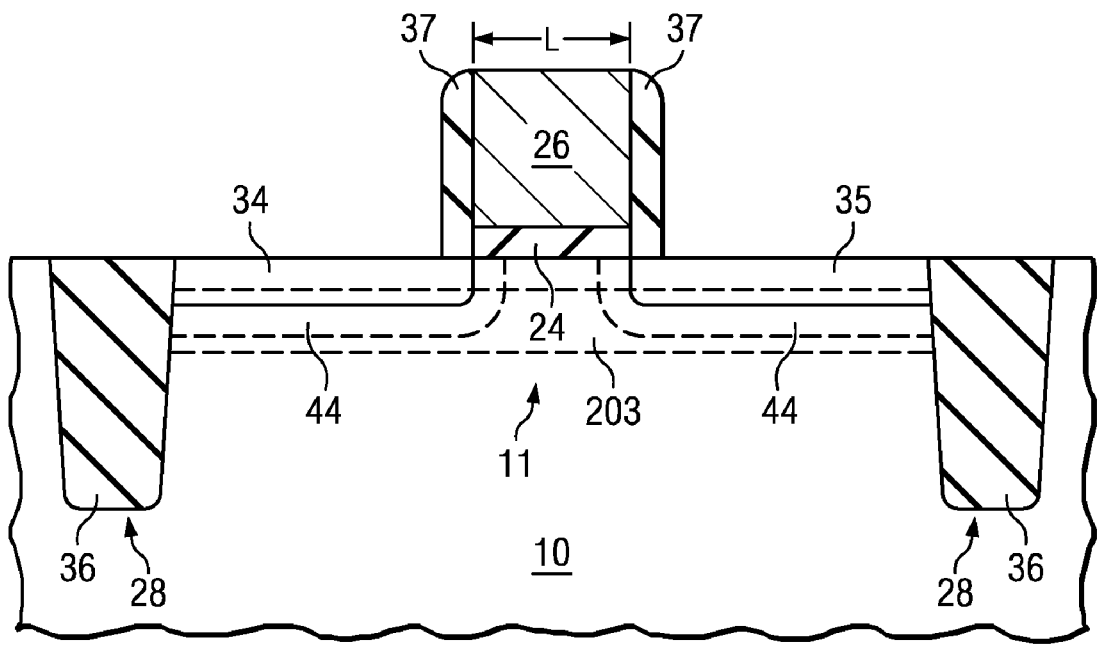
Figure 3C:
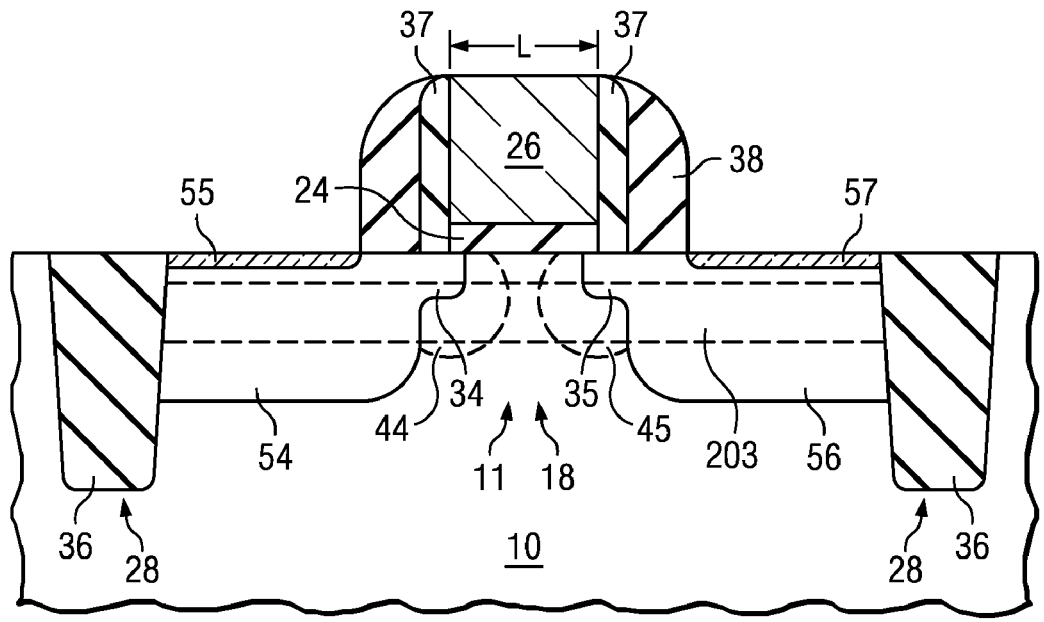
Figure 4:
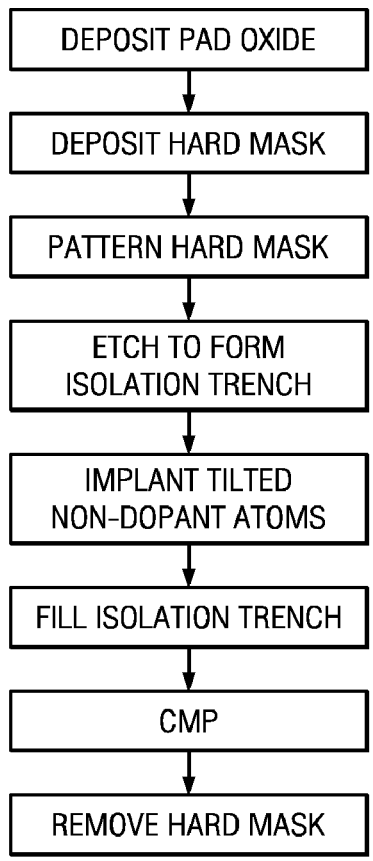
FIG. 4 illustrates a flow diagram of one implementation of the embodiment process illustrated in FIG. 3.
Figure 5A:
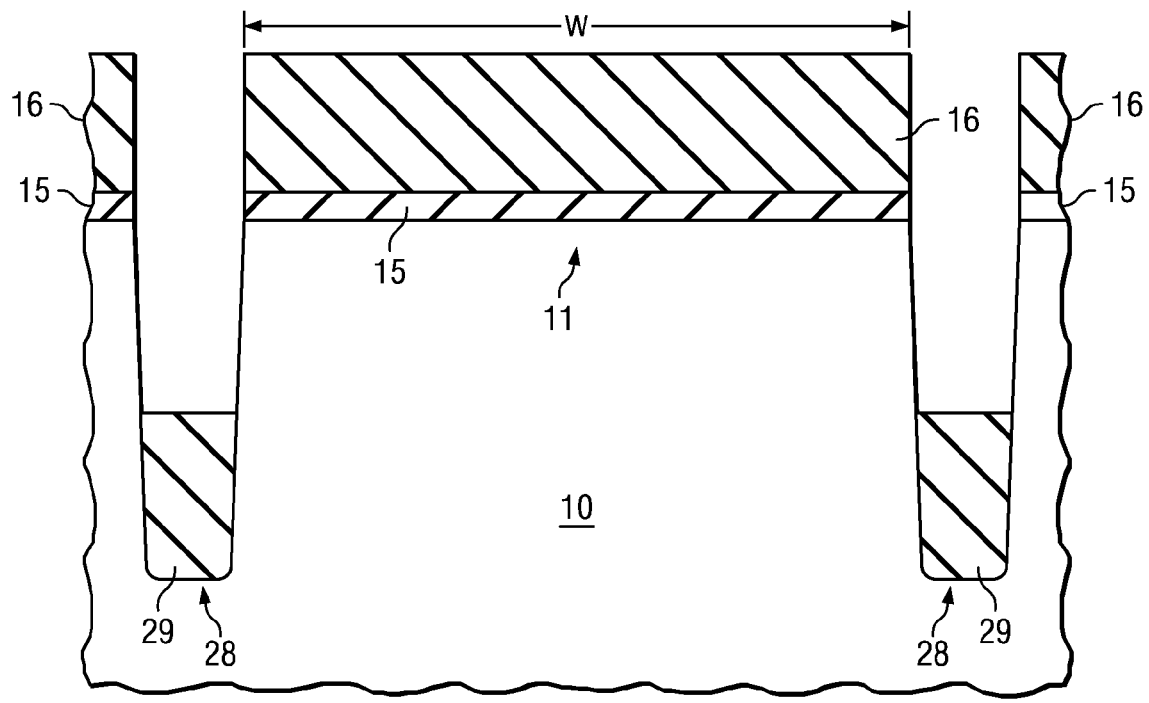
FIGS. 5a-5c illustrates a cross section along the width of an embodiment process during the formation of the STI.
Figure 5B:
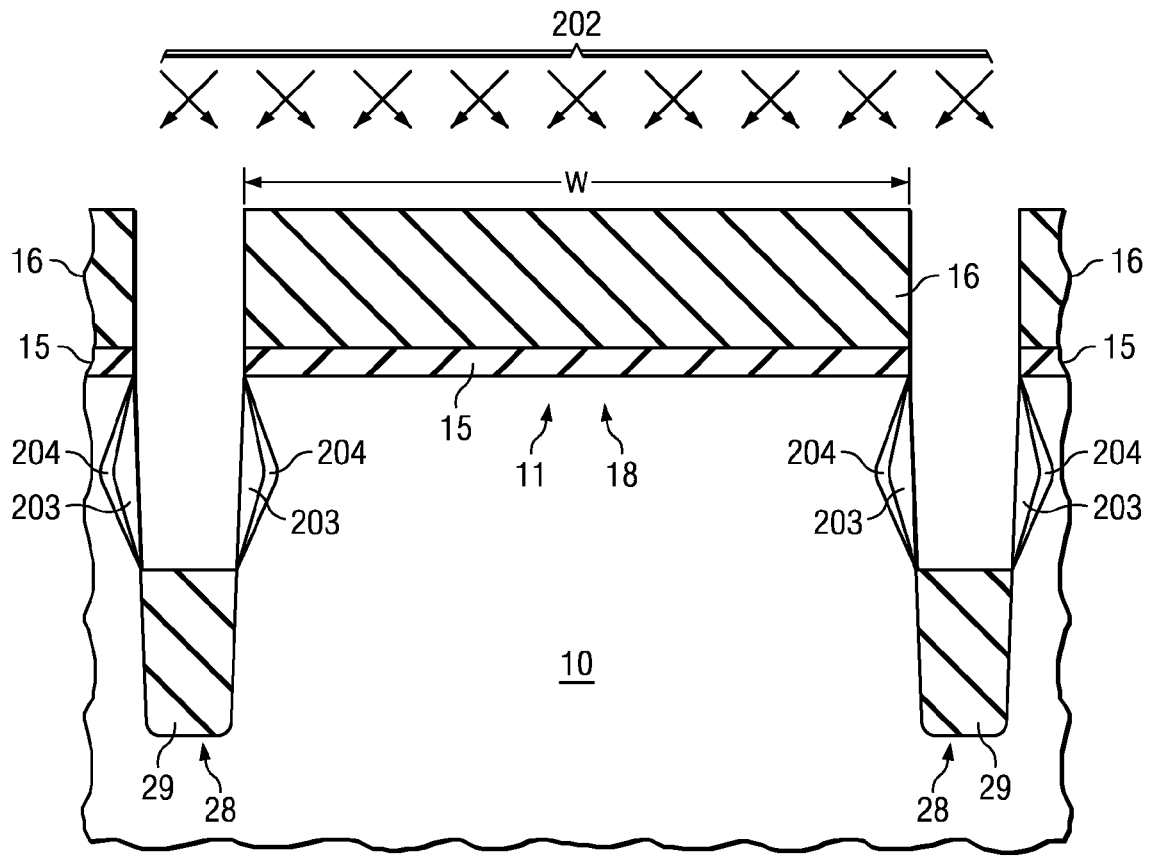
Figure 5C:
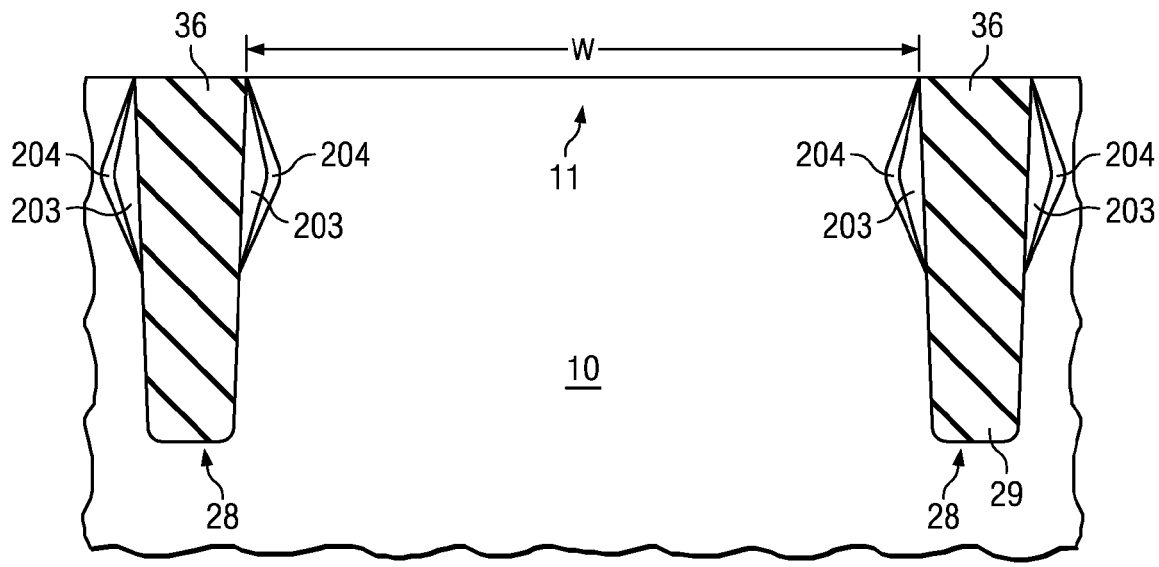
Figure 6:
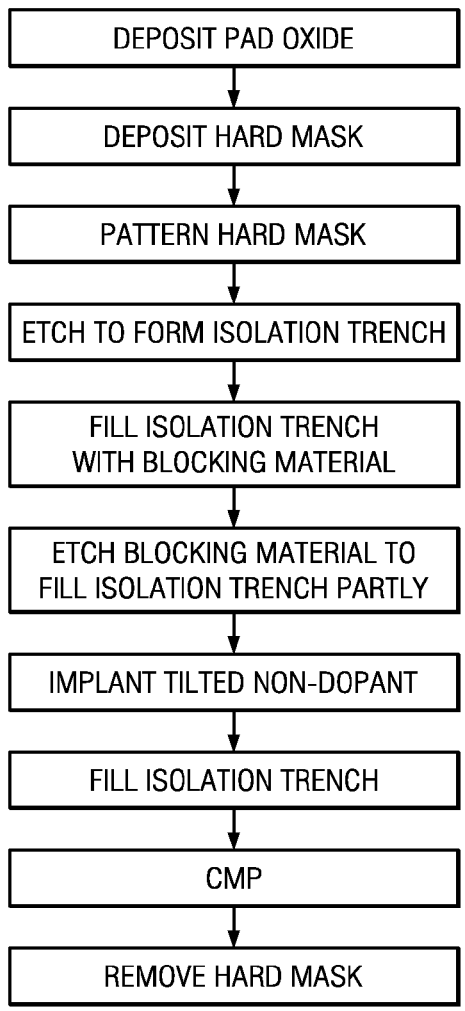
FIG. 6 illustrates a flow diagram of one implementation of the embodiment process illustrated in FIG. 5.
Figure 7:
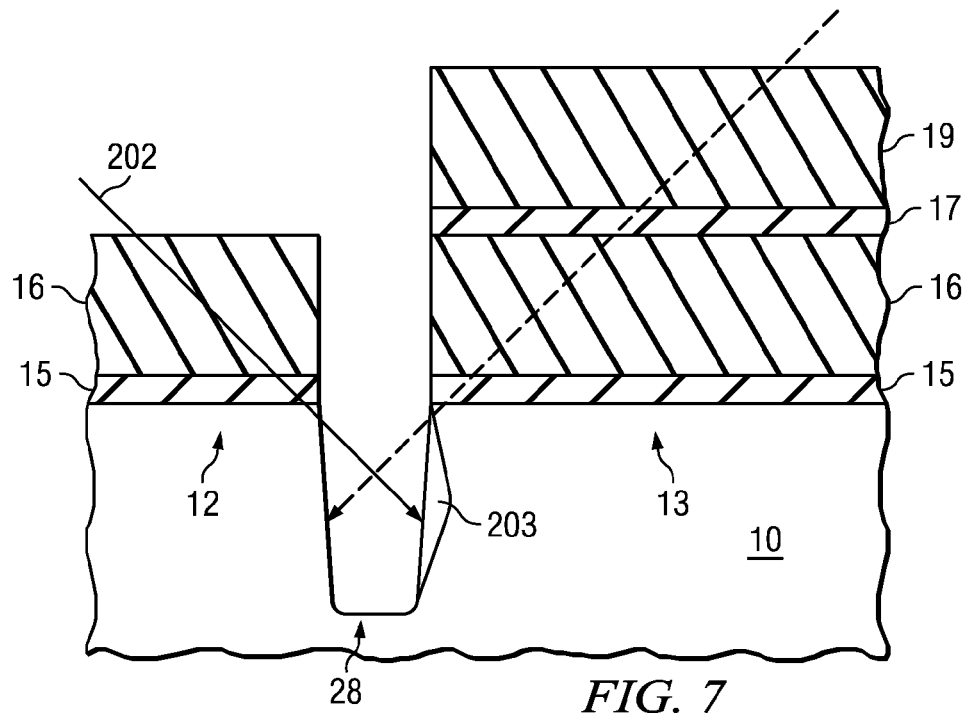
FIG. 7 illustrates a cross section along the width of an embodiment process during the formation of the STI.
Figure 8:
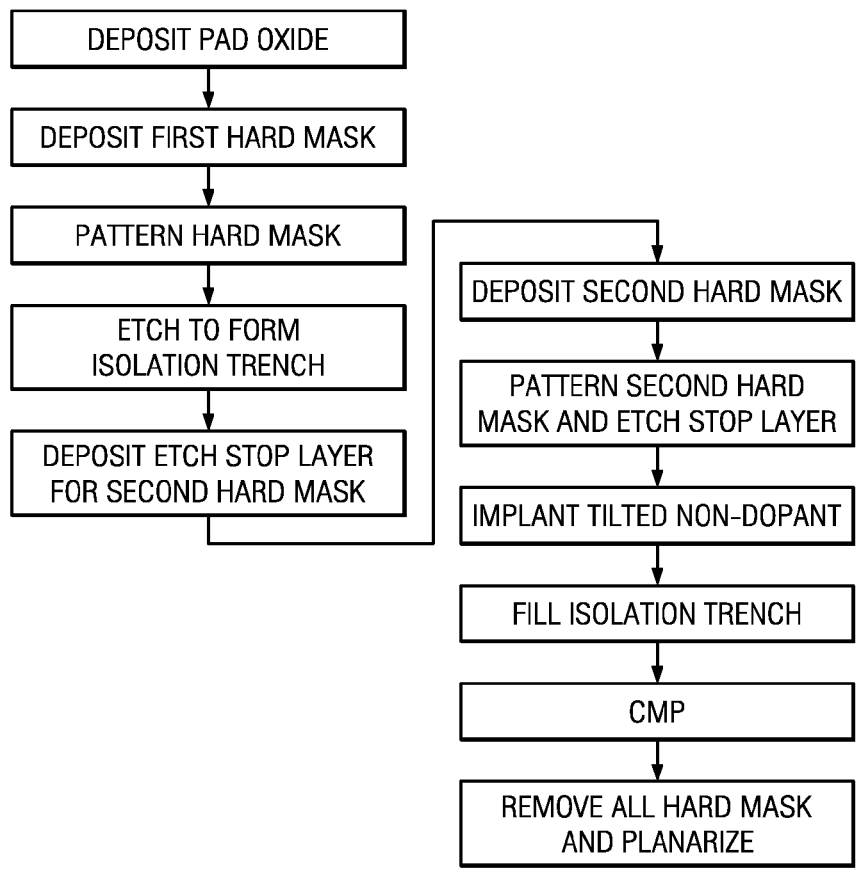
FIG. 8 illustrates a flow diagram of one implementation of the embodiment process illustrated in FIG. 7.

A transistor device in accordance with an embodiment of the current invention is illustrated in FIG. 1 and various methods for the formation of transistor devices using these concepts will then be described with respect to the cross-sectional views of FIGS. 2a-2e, FIGS. 3a-3c, FIGS. 5a-5c, and FIG. 7 and the flow charts of FIGS. 4, 6 and 8.

Figure 1A:
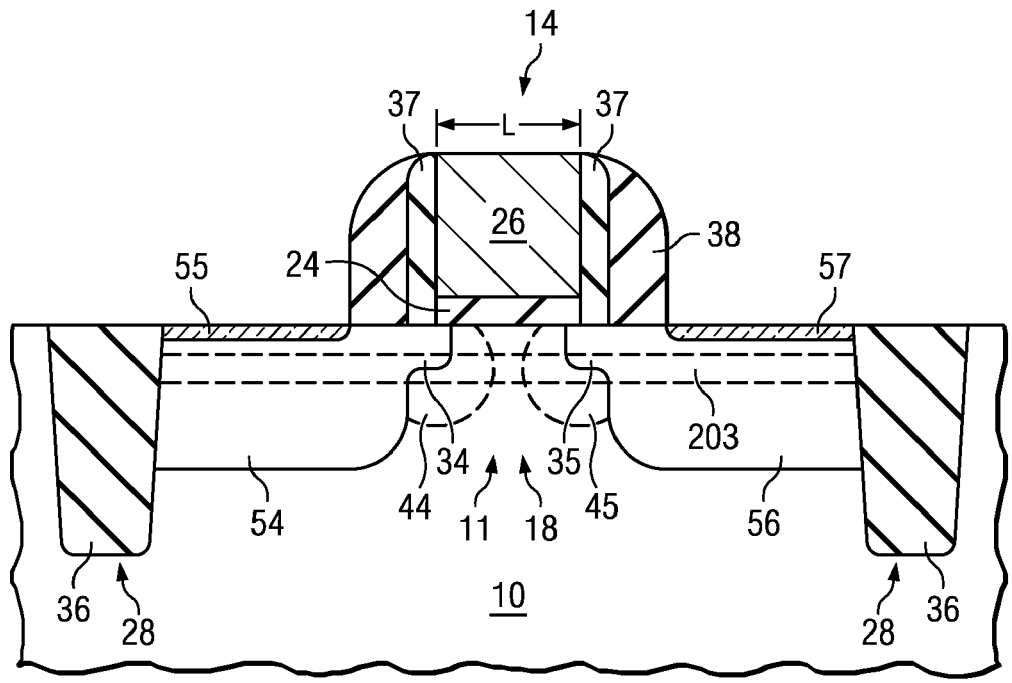

FIG. 1 illustrates an embodiment of the invention, wherein a transistor 14 is disposed in a semiconductor body 10. Further, FIG. 1a shows the device cross section near the STI 36 edge along the device length L. Referring to FIG. 1a, the transistor 14 includes an active area 11 disposed between STI 36, and a channel region 18 disposed in the active area 11. A gate dielectric 24 overlies the channel region 18 and a gate electrode 26 overlies the gate dielectric 24. A source extension region 34 and a drain extension region 35 are disposed in the semiconductor body 10 and spaced from each other by the channel region 18. Halo regions 44 and 45 are disposed in the semiconductor body 10 around the extension regions 34 and 35. A non-dopant region 203 is disposed in the semiconductor body 10. However, the non-dopant region 203 decays with distance from the STI 36 edge along the device width and may not be present in the middle of the transistor 14. A source region 54 and a drain region 56 are disposed in the semiconductor body 10 and are connected to the extension regions 34 and 35, respectively. Low resistivity silicide regions 55 and 57 enable contact formation to the source and drain regions 54 and 56.

Figure 1B:
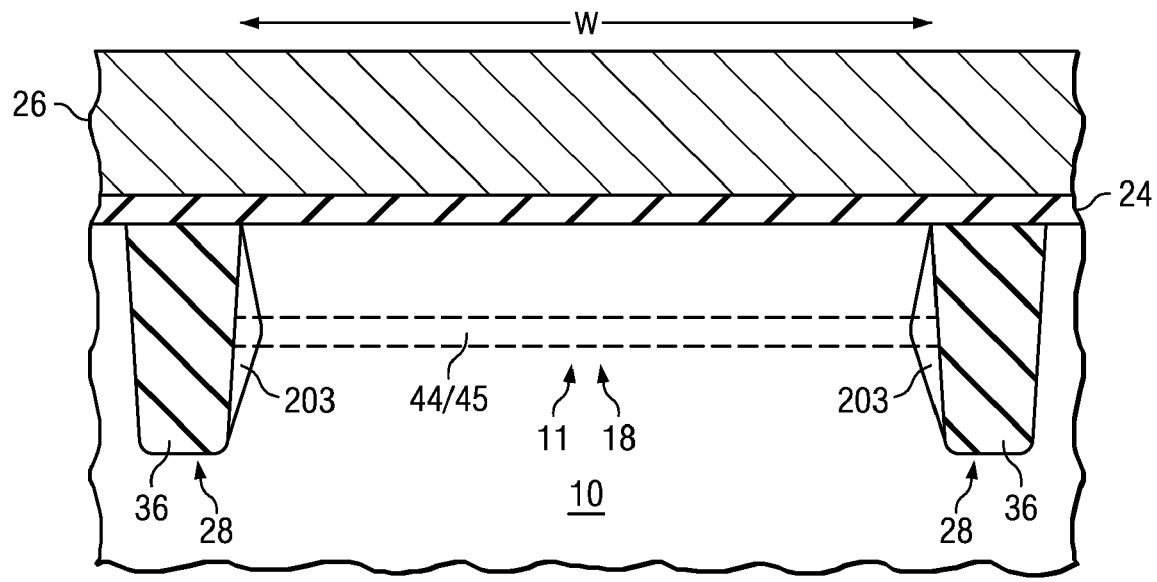

FIG. 1b illustrates a cross section along the device width W, wherein the cut is at the center of the channel region 18. An active area 11 is disposed between STIs 36. The channel region 18 is covered by the gate dielectric 24 and the gate electrode 26. The halo profile is shown by region 44/45 in FIG. 1b.

Figure 1C:
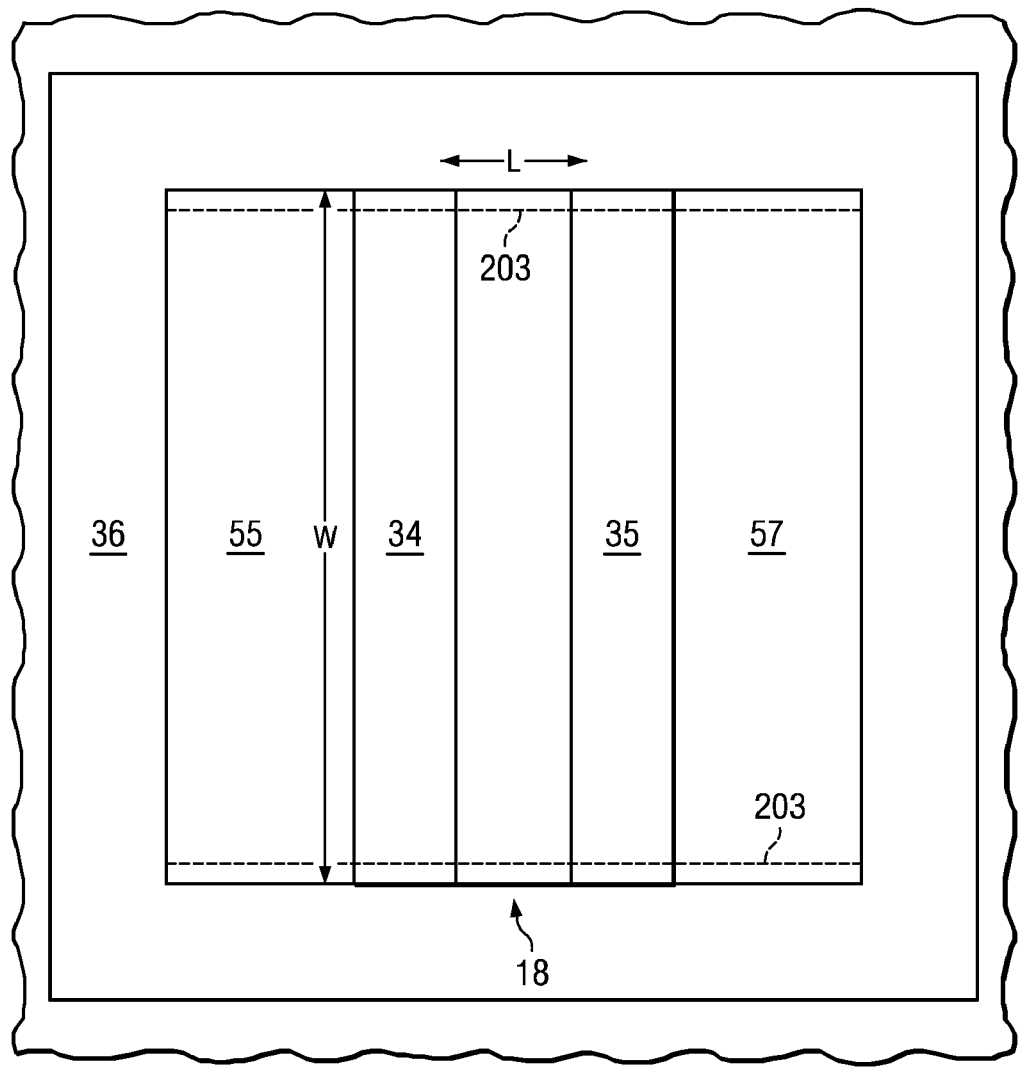

FIG. 1c illustrates a top cross section of the device and clearly illustrates the width W and length L of the device. The cut is at the top surface of the semiconductor wafer. The silicide regions 55 and 57 as well as the source/drain extension regions 34/35 are highlighted. The non-dopant layer 203 is located at the edge of the transistor 14 along the STI 36.

Halo profiles 44 and 45 are most susceptible to isolation trench effects and are also among the most critical parameters that govern transistor electrostatics. The presence of the non-dopant layer 203 constrains the halo dopant atoms near the isolation trenches 28. For example, the presence of the non-dopant layer 203 may constrain the diffusion of dopant atoms into the STI liner (dose loss) or mitigate stress enhanced diffusion arising from increased stress in the STI region. Hence, this yields a spatially uniform halo profile (along the width) in the channel region 18 for a large width device. Such uniform halo profile around the trench sidewalls translates to less variation in device electrical behavior between narrow and large width devices. For example, devices with widths smaller than 300 nm tend to be increasingly dominated by the STI 36 and can be called narrow width devices. Consequently, devices processed with this invention have a uniform or flat narrow width effect. In other words, devices of different widths have similar electrostatics (e.g., threshold voltage).

A specific example of the halo dopant is boron, although other (for example interstitial diffusers) may also be used such as indium, phosphorus, and arsenic. Hence, the current embodiment is applied to an nMOS transistor. In other embodiments, the present invention can also be applied to other devices such as pMOS transistors. In those embodiments, the halo dopant is typically arsenic, although in some cases phosphorus is also used.

In other embodiments, other semiconductor devices and elements can be fabricated separated by isolation trenches 36. For example, if the doped regions 54 and 56 are formed with opposite polarities, the transistor 14 can be operated as a diode or as part of a bipolar transistor. In another example, the source/drain regions 54/56 can be used as contacts to one plate of a capacitor while the gate electrode 26 is used as another gate of a capacitor. This capacitor could be used, for example, as a decoupling capacitor between supply lines (e.g., $V_{DD}$ and ground) on a semiconductor chip.

FIGS. 2a-2e and FIGS. 3a-3c provide cross-sectional diagrams illustrating a first embodiment method of forming a transistor of the present invention and FIG. 4 illustrates an associated flow diagram of one implementation of the process. A second embodiment will then be described with respect to the cross-sectional views of FIG. 5 and an associated flow diagram of FIG. 6. While certain details may be explained with respect to only one of the embodiments, it is understood that these details can also apply to other ones of the embodiments.

Referring first to FIG. 2a, a semiconductor body 10 is provided. In the preferred embodiment, the semiconductor body 10 is a silicon wafer. Some examples of the semiconductor body 10 are a bulk mono-crystalline silicon substrate (or a layer grown thereon or otherwise formed therein), a layer of {110} silicon on a {100} silicon wafer, a layer of a silicon-on-insulator (SOI) wafer, or a layer of a germanium-on-insulator (GeOI) wafer. In other embodiments, other semiconductors such as silicon germanium, germanium, gallium arsenide, indium arsenide, indium gallium arsenide, indium antimonide or others can be used.

In the first embodiment, isolation trenches 28 are formed in the semiconductor body 10 as shown in FIG. 2b. Further, FIG. 2b represents the cross section along the width W of the device. The isolation trenches 28 can be formed using conventional techniques. For example, a pad oxide layer 15 followed by a hard mask layer 16 is deposited on the semiconductor body 10. The hard mask layer 16 can be any suitable material such as silicon nitride that protects the active area 11 during an etch that forms the isolation trench 28. The hard mask layer 16 is patterned to expose the isolation trenches 28.

The isolation trench 28 can be patterned, for example, by dry etching using a patterned resist mask or the patterned nitride hard mask 16 (if the resist mask is removed after the hard mask patterning). The isolation trench 28 can be formed using known trench etching techniques such as reactive ion etching (RIE). For example, a single or multi-step RIE etch process may be performed which removes material in the exposed isolation regions so as to etch through any remaining nitride or oxide associated with the hard mask layer 16 and pad oxide layer 15, and etch into the semiconductor body 10 so as to form a trench having sidewalls and a bottom. The appropriate depth of the isolation trenches 28 is typically between about 200 nm and about 400 nm. The isolation trenches 28 define active area 11, in which integrated circuit components can be formed. The resist mask, if present is removed exposing the hard mask layer 16.

After the formation of the isolation trenches 28, the isolation trenches 28 are lined with a trench liner 30. In the current embodiment, the exposed silicon surfaces are thermally oxidized to form a thin oxide liner layer.

A non-dopant atom 202 is then implanted into isolation trenches 28 to create a non-dopant layer 203 as shown in FIG. 2c. The non-dopant atom implant is tilted or angled to improve coverage of the trench sidewalls. The tilt or angle referred in discussions here is relative to the wafer normal. Most of the non-dopant atoms 202 striking the hard mask layer 16 are absorbed, whereas the non-dopant atoms 202 that strike the isolation trenches 28 enter the semiconductor body 10. For clarity, the non-dopant atoms 202 implanted into the pad oxide layer 15 or the hard mask layer 16 are not shown in FIG. 2c. In some embodiments, the non-dopant implant may be implanted vertically (with 0 degree tilt).

The implant parameters: angle, energy, tilt, and number of rotations of the non-dopant atom 202 implant are chosen to maximize the concentration of the non-dopant atom 202 around the isolation trench 28 sidewalls. This helps to target the location of the peak concentration of the non-dopant atoms to match the location of the peak concentration of the halo implant (discussed below) from subsequent processing. In some embodiments, the implant parameters of the non-dopant implant are chosen to constrain the non-dopant layer 203 within about 100 nm from the top surface of the semiconductor body 10.

The presence of non-dopant atoms 202 around semiconductor regions undergoing oxidation can sometime have deleterious consequences. For example, the presence of some atoms such as fluorine increases oxidation, whereas the presence of some other atoms such as nitrogen or carbon decreases oxidation rates. Similarly, the inclusion of these non-dopants into the gate dielectric 24 can sometimes negatively impact gate dielectric reliability. In such cases, it may be important to constrain the non-dopant atoms 202 away from regions such as trench corners or a top surface that forms the gate dielectric 24. To avoid such negative impact, suitable implant conditions may be selected. For example, implant tilt can be targeted from about 10 degrees to about 45 degrees. Similarly, suitable implant energy can be selected to place peak concentration of the non-dopant atoms beyond about 200 Å from the oxidizing surface. In some cases, if it is desired to co-optimize the doping of both the isolation and halo profiles, a lower tilt such as less than 10 degrees may also be used.

Referring now to FIG. 2d, the preferred tilted non-dopant implant is a four rotation implant along the device width, wherein a total implant dose is divided into four implants, wherein each implant is performed at substantially the same angle, with the wafer being rotated 90 degrees after each implant. This four rotation implant creates a spatially symmetric non-dopant distribution around the isolation trenches 28. Such a four rotation implant may be necessary if perpendicular devices are present in the given technology. In some embodiments, the tilted non-dopant implant may be a two rotation implant.

The non-dopant implant in the preferred embodiment is a carbon ion but other ions such as fluorine, nitrogen, chlorine, silicon, germanium, lead, and combinations thereof can also be used. Similarly, the non-dopant implant can be an atomic, molecular or a cluster ion implant. As an example of a carbon implant, the implant dose can vary from about $1 \times 10^{13}/cm^2$ to about $2 \times 10^{15}/cm^2$ at an energy from about 2 keV to about 40 keV. In the preferred embodiment, a 15 keV carbon implant at a dose of $2 \times 10^{14}/cm^2$ is implanted at a tilt of about 30 degrees.

Although the typical non-dopant implant consists only of a single element, multiple implants can also be used. In some cases, it may be advantageous to use a multiple implant. For example, an additional implant may help by creating a local amorphous region around the isolation trenches 28. Some non-dopants, such as fluorine may show a beneficial behavior only if the implanted region is amorphized. Fluorine, if implanted in sub-amorphous regions can result in enhanced halo diffusion and result in a degraded halo profile. Similarly, amorphization of the implanted region can improve the effectiveness of carbon implants due to increase in substitutional carbon. An additional implant may also help tailor the non-dopant implant profile, for example, by removing the channeling tail of the implant. Hence, in some cases, multiple implants or co-implants may be needed to achieve the full entitlement of this invention. Some examples of multiple implants include nitrogen followed by germanium, germanium followed by nitrogen, fluorine followed by germanium, fluorine followed by silicon, carbon followed by germanium, or carbon followed by silicon. The sequence of these multiple implants can also be varied in some embodiments. Similarly, the implant parameters may be chosen differently for the multiple implants. As an example, the first implant could be a four rotation tilted germanium implant, whereas the second implant could be a two rotation tilted carbon implant.

In the preferred embodiment, the non-dopant atoms 202 were implanted after the formation of a trench liner 30. This was done to avoid loss of non-dopant atoms 202 during the trench liner 30 formation process. However, in a different embodiment, the non-dopant atoms 202 are implanted before the formation of the trench liner 30.

In some cases, a thermal anneal may be performed to partially or completely repair the non-dopant implant damage around the isolation trenches 28. In such cases, this anneal may be included either immediately following the implant or at a later stage in the processing.

Referring now to FIG. 2e, the isolation trenches 28 are then filled with an isolating material forming STI 36, while the hard mask layer 16 and pad oxide layer 15 are etched and removed. The isolating material can be a single material or multiple materials. Examples of isolating materials include oxides such as thermal oxide, High Density Plasma (HDP) oxide, HARP oxide, TEOS oxides and various nitrides. The isolation trenches 28 may also contain multiple liners on the bottom and sidewalls. Examples of liners include oxides, nitrides and combinations thereof. The isolation trenches 28 are then filled with an oxide, such as a HDP oxide. The HDP oxide is filled into the isolation trenches 28 using, as the name indicates, a high density plasma. In other embodiments, other trench filling processes can be used. For example, while the isolation trenches 28 are typically lined, this step can be avoided with newer fill materials (for example HARP™).

The top surface of the semiconductor body 10 is subsequently polished and planarized. Chemical mechanical polishing (CMP) is a specific example of the polishing process. The nitride hard mask layer 16 is etched followed by etching the STI 36 oxide to planarize it with the top silicon surface. In some embodiments, the STI 36 oxide is etched after CMP followed by removal of hard mask layer 16. The transistor 14 after this step is shown in FIG. 2e. The cross section of the same device along the perpendicular direction is shown in FIG. 3a. As this cross section is from about the edge of the isolation trenches 28, a uniform layer of the non-dopant layer 203 is shown. However, for larger width devices, the uniform non-dopant layer 203 may be absent moving away from the trench edge.

FIG. 3b shows the device after gate stack and source drain extension formation. A gate dielectric 24 is deposited over exposed portions of the semiconductor body 10. In one embodiment, the gate dielectric 24 comprises an oxide (e.g., $SiO_2$), a nitride (e.g., $Si_3N_4$), or a combination of oxide and nitride (e.g., SiON, or an oxide-nitride-oxide sequence). In other embodiments, a high-k dielectric material having a dielectric constant of about 5.0 or greater is used as the gate dielectric 24. Suitable high-k materials include $HfO_2$, $HfSiO_x$, $Al_2O_3$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples. Alternatively, the gate dielectric 24 can comprise other high-k insulating materials or other dielectric materials. As implied above, the gate dielectric 24 may comprise a single layer of material, or alternatively, the gate dielectric 24 may comprise two or more layers.

The gate dielectric 24 may be deposited by chemical vapor deposition (CVD), atomic layer deposition (ALD), metal organic chemical vapor deposition (MOCVD), physical vapor deposition (PVD), or jet vapor deposition (JVD), as examples. In other embodiments, the gate dielectric 24 may be deposited using other suitable deposition techniques. The gate dielectric 24 preferably comprises a thickness of about 10 Å to about 60 Å in one embodiment, although alternatively, the gate dielectric 24 may comprise other dimensions. In the illustrated embodiment, the same dielectric layer would be used to form the gate dielectric 24 for both the p-channel and n-channel transistors. This feature is not however required. In alternate embodiments, the p-channel transistors and the n-channel transistors could each have different gate dielectrics.

A gate electrode 26 is formed over the gate dielectric 24. The gate electrode 26 preferably comprises a semiconductor material, such as polysilicon or amorphous silicon, although alternatively, other semiconductor materials may be used for the gate electrode 26. In other embodiments, the gate electrode 26 may comprise TiN, TiC, HfN, TaN, TaC, W, Al, Ru, RuTa, TaSiN, NiSi$_x$, CoSi$_x$, TiSi$_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, a partially silicided gate material, a fully silicided gate material (FUSI), other metals, and/or combinations thereof, as examples. In one embodiment, the gate electrode 26 comprises a doped polysilicon layer underlying a silicide layer (e.g., titanium silicide, nickel silicide, tantalum silicide, cobalt silicide, or platinum silicide).

The gate electrode 26 may comprise a plurality of stacked gate materials, such as a metal under layer with a polysilicon cap layer disposed over the metal under layer. A gate electrode 26 having a thickness of between about 400 Å to about 2000 Å may be deposited using CVD, PVD, ALD, or other deposition techniques.

P-channel and n-channel transistors preferably include gate electrodes 26 formed from the same layers. If the gate electrodes 26 include a semiconductor, the semiconductor can be doped differently for the p-channel transistors and the n-channel transistors. In other embodiments, different types of transistors can include gates of different materials and/or thicknesses.

The gate layer (and optionally the gate dielectric layer) is patterned and etched using known photolithography techniques to create the gate electrode 26 of the proper pattern. After formation of the gate electrodes, a thin layer of spacers 37 are formed. The spacers 37 are formed from an insulating material such as an oxide and/or a nitride, and can be formed on the sidewalls of the gate electrode 26 and gate dielectric 24. The spacers are typically formed by the deposition of a conformal layer followed by an anisotropic etch. The process can be repeated for multiple layers, as desired. In some cases, if the gate electrode 26 is polysilicon, the thin spacers 37 may be formed by poly oxidation.

The present embodiment is a gate first process, i.e., the gate is formed before the source/drain regions of the transistor 14 are fabricated. Some embodiments may use a gate last approach. Such integration schemes are typically adopted to overcome the thermal processing limitations of the gate electrode material or gate dielectric material. In such cases, the gate electrode 26 (and sometimes the gate dielectric 24) formed above is a sacrificial layer and is etched and removed. A new gate dielectric and gate electrode may be formed at a suitable step before the formation of the ILD layer.

The source/drain extension regions (34 and 35) and halo regions 44 can be implanted using this structure (the gate electrode 26 and thin spacer 37) as a mask. If an n-type transistor is to be formed, an n-type ion implant is used to form the source/drain extension regions 34/35. In the preferred embodiment, arsenic ions are implanted into the source/drain extension regions 34/35. For example, arsenic ions can be implanted with a dose of about $1 \times 10^{14}$ cm$^{-2}$ to about $3 \times 10^{15}$ cm$^{-2}$ and an implant energy between about 0.5 keV and about 5 keV. In other embodiments, other materials, such as phosphorus and antimony can be implanted. If a p-type transistor is to be formed, a p-type ion implant is used to form source/drain extension regions 34/35. For example, boron ions can be implanted with a dose of about $1 \times 10^{14}$ cm$^{-2}$ to about $3 \times 10^{15}$ cm$^{-2}$ at an implant energy between about 0.1 keV to about 1 keV. In other embodiments, other materials, such as BF$_2$, molecular boron, or cluster boron can be implanted.

A tilted implant is used to form the halo regions 44 at this step. The tilt of the typical halo implant relative to the wafer normal varies from about 0 degrees to about 45 degrees. A p-type halo implant is used to form the halo regions 44 and 45 for an n-channel transistor. In the preferred embodiment, the p-type halo implant is boron with a dose of about $1 \times 10^{13}$ cm$^{-2}$ to about $2 \times 10^{14}$ cm$^{-2}$ at an implant energy between about 1 keV and about 10 keV. Other implants such as indium, BF$_2$, molecular boron, or cluster boron can also be used as p-type halo dopants. An n-type halo implant is used for a p-channel transistor. As a specific example, the n-type halo implant can be arsenic with a dose of about $1 \times 10^{13}$ cm$^{-2}$ to about $2 \times 10^{14}$ cm$^{-2}$ at an implant energy between about 10 keV to about 100 keV. In some embodiments, the extension implants can also contain additional implants to tailor the junction profiles. Some examples of such implants include silicon, germanium, fluorine, carbon, nitrogen, and/or combinations thereof.

FIG. 3c shows the device after formation of source/drain spacers 38, and source/drain regions 54/56. Source/drain spacers 38 can be formed on the sidewalls of the existing thin spacers 37. The sequence of the deposition and etch used to form the source drain spacers 38 determines the final shape of the spacers 38. The source/drain spacers 38 may be a single layer or multiple layers. Low temperature processes are used during deposition of the spacers 38 to avoid deleterious diffusion of junctions during their deposition. An ion implant step followed by a rapid thermal anneal (RTA) forms the source/drain regions 54/56 of the transistor 14. Similar to the formation of the source/drain extension regions 34/35, an n-type ion implant is used to form the heavily doped source/drain regions 54/56 for an n-channel transistor. In the preferred embodiment, arsenic ions are implanted into the source/drain regions 54/56. For example, arsenic ions can be implanted with a dose of about $1 \times 10^{15}$ cm$^{-2}$ to about $5 \times 10^{15}$ cm$^{-2}$ and at an implant energy between about 5 keV and about 30 keV. In other embodiments, other materials, such as phosphorus and antimony can be implanted. If a p-type transistor is to be formed, a p-type ion implant is used to form the heavily doped source/drain regions 54/56. For example, boron ions can be implanted with a dose of about $1 \times 10^{15}$ cm$^{-2}$ to about $3 \times 10^{15}$ cm$^{-2}$ at an implant energy between about 1 keV and about 5 keV. In other embodiments, other materials, such as BF$_2$, molecular boron, or cluster boron can also be implanted. Similar to the extension implants, in some embodiments, fluorine, carbon, nitrogen, silicon, germanium, or combinations of these materials are co-implanted along with the source/drain implants.

A source/drain anneal is used to activate the dopants and form the active junctions. This anneal may be a fast RTA anneal or any other suitable anneal. This anneal step is preferably performed at a temperature between about 900° C. and about 1200° C., for a time between about 0.1 ms and about 1 s. For example, an RTA can be performed at a temperature of 1090° C. for 0.1 s. In some cases, a milli-second anneal such as a flash lamp or a laser anneal may also be used either alone or in combination with an RTA anneal.

Referring to FIG. 3c, a suitable silicide metal is deposited over the gate electrode 26 and the source/drain regions 54/56. The semiconductor body 10 is then heated to about 500° C. to about 700° C. The exposed part of the source/drain regions 54/56 and gate electrode 26 react with the deposited silicide metal to form a single layer of metal silicide 55 and 57. Any un-reacted silicide metal may be removed. In the preferred embodiment, the silicide metal is nickel platinum, but could also be nickel, cobalt, copper, molybdenum, titanium, tantalum, tungsten, erbium, zirconium, platinum, or combinations thereof. The preferred anneal is about 500° C. but any other suitable anneal can be used. The silicidation of the source/drain regions 54/56 result in formation of silicide regions (55 and 57) with a thickness of about 50 Å to about 300 Å. In some embodiments, the gate electrode 26 may be blocked to avoid any silicide or silicide metal formation. Such blocking of the gate electrode may be beneficial, if the gate electrode is made of a material other than polysilicon.

Further processing continues as in a typical integrated chip manufacturing process. Additional layers such as stress liners inter level dielectric (ILD) layers, and metallization layers that interconnect the various components are also included in the chip, but are not illustrated herein for the purpose of simplicity. For example, typically, a stress liner is deposited over the gate electrode that also is a contact etch stop liner followed by deposition of an ILD layer. The source, drain, and gate electrodes contacts are formed through the contact etch stop layer (CESL) liner and the ILD layer.

A second embodiment will now be described with reference to the cross-sectional diagrams of FIGS. 5a-5c and the flow diagram of FIG. 6. In this embodiment, a part of the isolation trenches 28 are filled to form a blocking layer 29 on the bottom of the trench. This blocking layer 29 blocks the subsequent non-dopant implant from penetrating the trench bottom surface.

Referring first to FIG. 5a, a semiconductor body 10 is provided. Isolation trenches 28 are formed in the semiconductor body as described previously. According to an aspect of the present invention, the isolation trenches 28 may be partially filled with an implant masking material by substantially completely filling the isolation trenches 28. The blocking layer 29 may be an oxide layer. For example, a suitable oxide deposition process such as the HDP oxide deposition process may be used. Other examples include low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS). After the isolation trenches 28 are completely or substantially completely filled, an etch-back process is employed wherein oxide is removed from a top portion of the isolation trenches 28, while the oxide in the bottom portion of the isolation trenches 28 remain therein.

The tilted non-dopant atom 202 is then implanted into the semiconductor body 10 as shown in FIG. 5b. Non-dopant atoms 202 that strike a top sidewall portion of the isolation trenches 28 pass through and enter the semiconductor body 10, while non-dopant atoms 202 that strike the oxide in the bottom portion of the isolation trenches 28 are blocked substantially from entering the semiconductor body 10 along a bottom and bottom sidewall portion thereof. Hence, only a small non-dopant region 203 around the isolation trenches 28 is formed that contains the non-dopant atoms 202. This embodiment is especially useful in certain circumstances. As an example, the behavior of the non-dopant atoms 202 can be significantly different in amorphous regions relative to crystalline regions of the semiconductor body 10. For example, while the amorphous regions may help to retard diffusion, the crystalline parts may increase diffusion. In such cases, the crystalline parts of the semiconductor body 10, such as towards the isolation trenches 28 will suffer from degraded junctions resulting in poorer electrical isolation. Fluorine is one specific example of a non-dopant that behaves differently in amorphous and crystalline regions. Blocking layer 29 minimizes the dose of the non-dopant atoms 202 in crystalline regions, by creating amorphous pockets 204 around corners of the isolation trenches 28.

Referring now to FIG. 5c, the remaining portion of the isolation trenches 28 are filled with a dielectric material such as oxide or some other electrically isolating material forming STI 36. In one example, the HDP oxide deposition process may be re-initiated to fill the rest of the isolation trenches 28. Alternatively, other dielectric deposition processes may be employed and are contemplated by the present invention. In a different embodiment of this process, the blocking layer 29 may be removed to open the isolation trenches 28 again. The isolation trenches 28 are now filled with a new fill material. This process may be used if the blocking layer used earlier had a different property than the STI 36 fill material. Hence, it is removed before further processing.

The semiconductor body 10 is then polished and planarized using, for example a CMP process. The hard mask layer 16 and then the pad oxide layer 15 are etched to expose the active area 11 as illustrated in FIG. 5c. Further processing continues as described earlier starting from FIGS. 3a-3c.

In another embodiment of the current invention, the amount of non-dopant atoms 202 entering the n-channel device relative to the p-channel device may be independently controlled. For instance, it may be possible that the non-dopant atoms 202, while improving the n-channel halo profile, degrade the p-channel halo profile. In such circumstances, an additional patterning can result in different implant blocking layers covering the n-channel region relative to the p-channel region. For STIs 36 built with narrow aspect ratios, such a structure can modulate the dose of non-dopant atoms 202 entering the n-channel regions relative to the p-channel regions. This embodiment is explained with reference to the cross-sectional diagram of FIG. 7 and the flow diagram of FIG. 8.

Isolation trenches 28 are formed in the semiconductor body 10 as described previously. A second implant blocking layer 19 such as a nitride hard mask layer is deposited on the semiconductor body. A etch stop layer 17 such an oxide may be deposited before the second implant blocking layer 19. Using conventional lithography techniques, the second implant blocking layer 19 and the etch stop layer 17 are patterned. The first hard mask 16 and isolation trench 28 are now exposed in the unmasked regions as illustrated in FIG. 7. Tilted non-dopant atoms 202 are then implanted into the semiconductor body 10. The second implant blocking layer 19 blocks most of the non-dopant atoms 202 from entering the p-channel region 12 whereas the non-dopant atoms 202 entering the n-channel region 13 form the non-dopant region 203. In some embodiments, region 12 is an n-channel device and region 13 is a p-channel device, thus blocking the implant 202 from the n-channel device. The isolation is then filled with the dielectric material to form STI, and all other layers (all the hard masks, etch stop layers, oxide layers) are etched and polished to expose the active areas (not shown). Further processing continues as described earlier starting from FIGS. 3a-3c.

It will also be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A method of fabricating a semiconductor structure, the method comprising:
   etching a trench with sidewalls and a bottom surface in a semiconductor body;
   implanting carbon and/or nitrogen ions into the trench, wherein the carbon and/or nitrogen ions are implanted in four equal parts separated by 90 degrees around a direction normal to the semiconductor body;
   filling the trench with a dielectric to form a trench isolation region; and
   doping to form an active region disposed in the semiconductor body, wherein the trench isolation region is formed around the active region.

2. The method of claim 1, wherein the semiconductor body comprises a semiconductor substrate.

3. The method of claim 1, wherein the carbon and/or nitrogen ions are implanted at an angle not normal to the bottom surface of the trench.

4. The method of claim 3, wherein the angle is greater than 10 degrees.

5. The method of claim 1, wherein a change in dopant profile is localized around the edges of the trench.

6. The method of claim 1, wherein addition of the angled carbon and/or nitrogen implant results in a matching of device electrostatics between a narrow width transistor to that of a transistor with a larger width.

7. The method of claim 6, wherein the matching of device electrostatics means a matching of threshold voltage.

8. The method of claim 6, wherein the narrow width transistor has an active width less than 300 nm.

9. The method of claim 1, wherein a trench liner is deposited over the sidewalls and the bottom surface of the trench prior to the carbon and/or nitrogen implant.

10. The method of claim 1, wherein the active region comprises part of a MOS transistor.

11. A method of fabricating a semiconductor structure, the method comprising:
    providing an active region by etching isolation trenches in a semiconductor body, each isolation trench having sidewalls and a bottom surface;
    implanting non-dopant ions into the trenches at an angle not normal to the bottom surface; the non-dopant ions forming a non-dopant distribution region spatially symmetric around the isolation trenches;
    filling the trench with a dielectric to form a trench isolation region;
    implanting halo atoms; and
    doping to structure the active region disposed in the semiconductor body, wherein a location of a peak concentration of the non-dopant atoms match the location of a peak concentration of halo atoms.

12. The method of claim 11, wherein the non-dopant distribution region decays with distance from the trench.

13. The method of claim 11, wherein the non-dopant ions are implanted in four equal parts separated by 90 degrees around a direction normal to the semiconductor surface.

14. The method of claim 11, wherein non-dopant atoms comprise nitrogen, carbon, fluorine, silicon, or germanium.

15. The method of claim 11, wherein the angle not normal to the semiconductor surface comprises an angle from about 10 degrees to about 45 degrees from a direction normal to the semiconductor surface.

16. The method of claim 11, wherein a majority of the non-dopant atoms is placed away from a periphery of trench corners.

* * * * *